(12) United States Patent
Khlat et al.

(10) Patent No.: US 7,773,691 B2
(45) Date of Patent: Aug. 10, 2010

(54) POWER CONTROL SYSTEM FOR A CONTINUOUS TIME MOBILE TRANSMITTER

(75) Inventors: Nadim Khlat, Cugnaux (FR); Ruediger Bauder, Otterfing (DE)

(73) Assignee: RF Micro Devices, Inc., Greensboro, NC (US)

( * ) Notice: Subject to any disclaimer, the term of this patent is extended or adjusted under 35 U.S.C. 154(b) by 661 days.

(21) Appl. No.: 11/113,873

(22) Filed: Apr. 25, 2005

(65) Prior Publication Data
US 2006/0239380 A1 Oct. 26, 2006

(51) Int. Cl.
*H04K 1/02* (2006.01)

(52) U.S. Cl. .................. 375/296; 370/252; 370/318; 375/298; 398/94; 398/120; 398/197; 455/13.4; 455/522

(58) Field of Classification Search .................. 330/279; 341/143; 365/233; 375/298; 370/252, 335, 370/391; 455/126, 437, 522; 465/102; 714/774
See application file for complete search history.

(56) References Cited

U.S. PATENT DOCUMENTS

| | | | | |
|---|---|---|---|---|
| 4,996,500 A | * | 2/1991 | Larson et al. | 330/279 |
| 5,646,621 A | * | 7/1997 | Cabler et al. | 341/143 |
| 6,690,652 B1 | * | 2/2004 | Sadri | 370/252 |
| 6,728,163 B2 | * | 4/2004 | Gomm et al. | 365/233 |
| 2002/0071497 A1 | * | 6/2002 | Bengtsson et al. | 375/298 |
| 2004/0047329 A1 | * | 3/2004 | Zheng | 370/342 |
| 2004/0219891 A1 | * | 11/2004 | Hadjichristos | 455/102 |

OTHER PUBLICATIONS

International Search Report for PCT/US06/12619 mailed May 8, 2007.

* cited by examiner

*Primary Examiner*—David C Payne
*Assistant Examiner*—Adolf Dsouza
(74) *Attorney, Agent, or Firm*—Withrow & Terranova, P.L.L.C.

(57) ABSTRACT

Power control circuitry is provided for controlling an output power of a transmitter of a mobile terminal operating according to a continuous time transmit scheme such as Wideband Code Division Multiple Access (WCDMA). Transmit circuitry processes a quadrature baseband signal to provide a radio frequency transmit signal. The radio frequency transmit signal is coupled to the power control circuitry via a coupler and processed to provide a feedback amplitude signal. The power control circuitry operates to remove an amplitude modulation component from the feedback signal using a reference amplitude signal generated from the quadrature baseband signal, thereby providing a measured gain signal of the transmit circuitry. Based on the measured gain signal and a target output power, the power control circuitry operates to control a gain of the transmit circuitry such that the output power of the transmit circuitry is within a predetermined range about the target output power.

18 Claims, 6 Drawing Sheets

POWER CONTROL SYSTEM FOR A CONTINUOUS TIME MOBILE TRANSMITTER

FIELD OF THE INVENTION

The present invention relates to output power control for a mobile terminal, and more particularly relates to output power control in a mobile terminal operating according to a continuous time transmit scheme such as Wideband Code Division Multiple Access (WCDMA).

BACKGROUND OF THE INVENTION

As with any other mobile terminal, there is a desire to increase the battery-life of mobile terminals operating according to a continuous time communication scheme, such as Wideband Code Division Multiple Access (WCDMA). One method of increasing the battery-life is to decrease current consumption of the transmitter during low power operation by decreasing the bias current. Changing the bias current of the transmitter also changes the gain, and thus the power step, of the transmitter. In order to achieve a target output power, it is desirable to have a power control system for correcting the gain of the transmitter after a change in bias current.

Traditional power control systems use a closed loop architecture where the output of the transmitter is coupled to a power detector. In order to measure the gain, the power detector uses an averaging filter that requires approximately 200 microseconds to remove the amplitude modulation from the detected signal. However, unlike the Global System for Mobile Communications (GSM), WCDMA requires that mobile terminals continuously transmit in each transmit slot. Further, for WCDMA, any gain adjustments must be completed within approximately the first 50 microseconds of each time slot. Thus, the traditional power control systems which require approximately 200 microseconds to remove the amplitude modulation from the detected signal are not suitable for measuring and adjusting the gain of the WCDMA transmitter during the first 50 microseconds of a time slot such that the output power is essentially equal to the target output power. Further, typical power control systems may be used to detect the gain in one time slot and adjust the gain in the next time slot. However, the bias current may change from one time slot to the next. As such, correcting the gain for one time slot based on the gain during the previous time slot is not desirable.

There remains a need for a fast and accurate power control system for detecting and correcting the gain of a continuous time transmitter of a mobile terminal during an acceptable period at the beginning of a transmit slot.

SUMMARY OF THE INVENTION

The present invention provides power control circuitry for controlling an output power of a transmitter of a mobile terminal operating according to a continuous time transmit scheme such as, but not limited to, Wideband Code Division Multiple Access (WCDMA). In general, transmit circuitry processes a quadrature baseband signal to provide a radio frequency transmit signal. The radio frequency transmit signal is coupled to the power control circuitry via a coupler and processed to provide a feedback amplitude signal essentially equal to an amplitude modulation component multiplied by a gain of the transmit circuitry. The power control circuitry operates to remove the amplitude modulation component from the feedback signal using a reference amplitude signal generated from the quadrature baseband signal, thereby providing a measured gain signal representative of the gain of the transmit circuitry. Based on the measured gain signal and a target output power, the power control circuitry operates to control the gain of the transmit circuitry such that the output power of the transmit circuitry is within a predetermined range about the target output power.

In one embodiment, the power control circuitry includes an envelope detector that processes the detected signal from the coupler to provide the feedback amplitude signal. Delay circuitry delays the reference amplitude signal in order to time-align the reference amplitude signal and the feedback amplitude signal. Gain determination circuitry removes the amplitude modulation component from the feedback amplitude signal using the delayed reference amplitude signal, thereby providing the measured gain signal. The measured gain signal may optionally be low-pass filtered to remove errors caused by time-alignment errors between the delayed reference amplitude signal and the feedback amplitude signal, non-linearities of the coupler and envelope detector, and DC offset.

In one embodiment, the gain determination circuitry includes logarithmic generation circuitry that operates to convert the delayed reference amplitude signal and feedback amplitude signal to logarithmic scale, or decibels. The decibel reference amplitude signal and the decibel feedback amplitude signal are subtracted by subtraction circuitry to provide the measured gain signal.

In another embodiment, the power control circuitry includes amplitude generation circuitry that provides the reference amplitude signal from the in-phase and quadrature-phase components of the quadrature baseband signal. In another embodiment, the transmit circuitry is a polar transmit system including a polar converter that converts the quadrature baseband signal to a polar signal, wherein the amplitude component of the polar signal is provided to the power control signal as the reference amplitude signal.

In yet another embodiment, the power control circuitry includes an envelope detector that processes the detected signal from the coupler to provide the feedback amplitude signal. The feedback amplitude signal is digitized by an over-sampling analog-to-digital (A/D) converter. Fine delay circuitry delays the digitized feedback amplitude signal, and the delayed feedback amplitude signal is decimated and filtered by decimation and filtering circuitry. Coarse delay circuitry delays the reference amplitude signal. Combined, the fine delay circuitry and the coarse delay circuitry operate to time-align the reference amplitude signal and the feedback amplitude signal. Gain determination circuitry removes the amplitude modulation component from the delayed feedback amplitude signal using the delayed reference amplitude signal, thereby providing the measured gain signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is preferably incorporated into a mobile terminal 10, such as a mobile telephone, a personal digital assistant, or the like, operating according to the Wideband Code Division Multiple Access (WCDMA) transmit scheme. However, while the present invention is described with respect to a WCDMA mobile terminal, the present invention is equally applicable to any continuous time transmit system.

Figure 1:
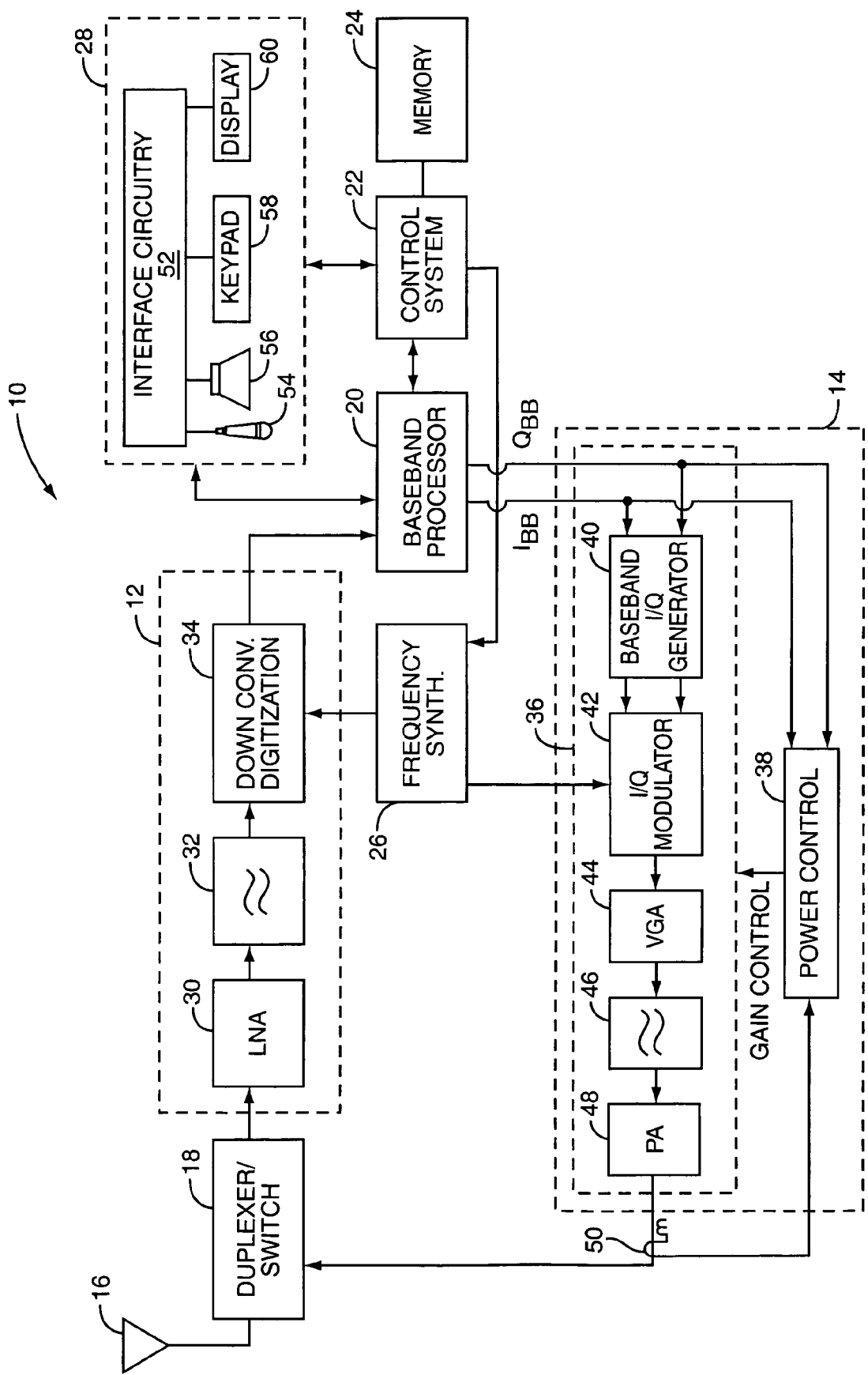
FIG. 1 illustrates a first exemplary embodiment of a mobile terminal according to one embodiment of the present invention.

The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information-bearing radio frequency signals from one or more remote transmitters provided by a base station (not shown). A low noise amplifier 30 amplifies the signal. A filter circuit 32 minimizes broadband interference in the received signal, while downconversion and digitization circuitry 34 downconverts the filtered, received signal to an intermediate or baseband frequency signal, and digitizes the intermediate frequency or baseband frequency signal into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. As illustrated, the encoded data is output to the radio frequency transmitter section 14 as a digital quadrature baseband signal ($I_{BB}$, $Q_{BB}$).

The radio frequency transmitter section 14 generally includes transmit circuitry 36 and power control circuitry 38. The illustrated transmit circuitry 36 is exemplary and includes baseband in-phase/quadrature-phase (I/Q) generation circuitry 40, I/Q modulation circuitry 42, a variable gain amplifier (VGA) 44, filtering circuitry 46, and power amplifier circuitry 48. The baseband I/Q generation circuitry 40 receives the digital quadrature baseband signal ($I_{BB}$, $Q_{BB}$) from the baseband processor 20 and operates to convert the quadrature baseband signal ($I_{BB}$, $Q_{BB}$) to an analog baseband or intermediate frequency quadrature signal. The in-phase and quadrature-phase components of the output of the baseband I/Q generation circuitry 40 are provided to the I/Q modulation circuitry 42, where they are upconverted to the desired radio frequency using a local oscillator frequency provided by the frequency synthesizer 26 and combined to provide a radio frequency signal. The radio frequency signal is amplified by the VGA 44 and filtered by filtering circuitry 46. Thereafter, the amplified, filtered radio frequency signal is amplified by power amplifier circuitry 48 to provide a radio frequency transmit signal at a level appropriate for transmission from the antenna 16.

According to the present invention, the power control circuitry 38 operates to control a gain of the transmit circuitry 36 based on a detected signal from coupler 50. The power control circuitry 38 may control the gain of the transmit circuitry 36 by, for example, controlling the gain of the power amplifier circuitry 48, activating or deactivating stages of the power amplifier circuitry 48, controlling the gain of the VGA 44, and/or controlling the gain of the I/Q modulation circuitry 42 using one or more gain control signals (GAIN CONTROL). The WCDMA transmit scheme requires that output power be controlled to within ±0.5 dB of a target output power, where the target output power may be provided by an associated base station. Further, continuous time transmit schemes, such as WCDMA, require that output power correction be performed during a predetermined time period during each time slot. For WCDMA, the output power must be corrected during the first 50 microseconds of each time slot. Thus, in one embodiment, the power control circuitry 38 operates to detect and correct the gain of the transmit circuitry 36 within 50 microseconds. In another embodiment, the power control circuitry 38 operates to detect and correct the gain of the transmit circuitry 36 within 20 microseconds.

In one embodiment, the battery-life of the mobile terminal 10 may be increased by reducing current drain during low power operation. For example, when operating below a predetermined threshold output power level, the control system 22 or the baseband processor 20 may control a bias current of the power amplifier circuitry 48, a load condition at the output of the power amplifier circuitry 48, and/or a bias current of the I/Q modulation circuitry 42 in order to decrease the bias current of the transmit circuitry 36. As a result, the gain of the transmit circuitry 36 decreases, and the power control circuitry 38 operates to adjust the gain of the transmit circuitry 36 such that the target output power is achieved.

For example, if the transmit circuitry 36 provides the radio frequency transmit signal at an output power in the range of 0 to +24 dB milliwatts (dBm), it may be desirable to reduce bias current when the target output power level is less than or equal to +14 dBm. If the target output power is reduced from +15 dBm to +14 dBm, the bias current of the transmit circuitry 36 may be reduced to a predetermined level resulting in a −3 dB change in the output power of the transmit circuitry. Since only a −1 dB change was desired, the power control circuitry 38 operates to adjust the gain of the transmit circuitry 36 such that the output power is within a predetermined range about the target output power.

A user may interact with the mobile terminal 10 via the interface 28, which may include interface circuitry 52 associated with a microphone 54, a speaker 56, a keypad 58, and a display 60. The interface circuitry 52 typically includes analog-to-digital converters, digital-to-analog converters, amplifiers, and the like. Additionally, it may include a voice encoder/decoder, in which case it may communicate directly with the baseband processor 20.

The microphone 54 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 56 by the interface circuitry 52. The keypad 58 and display 60 enable the user to interact with the mobile terminal 10, input numbers to be dialed and address book information, or the like, as well as monitor call progress information.

Figure 2:
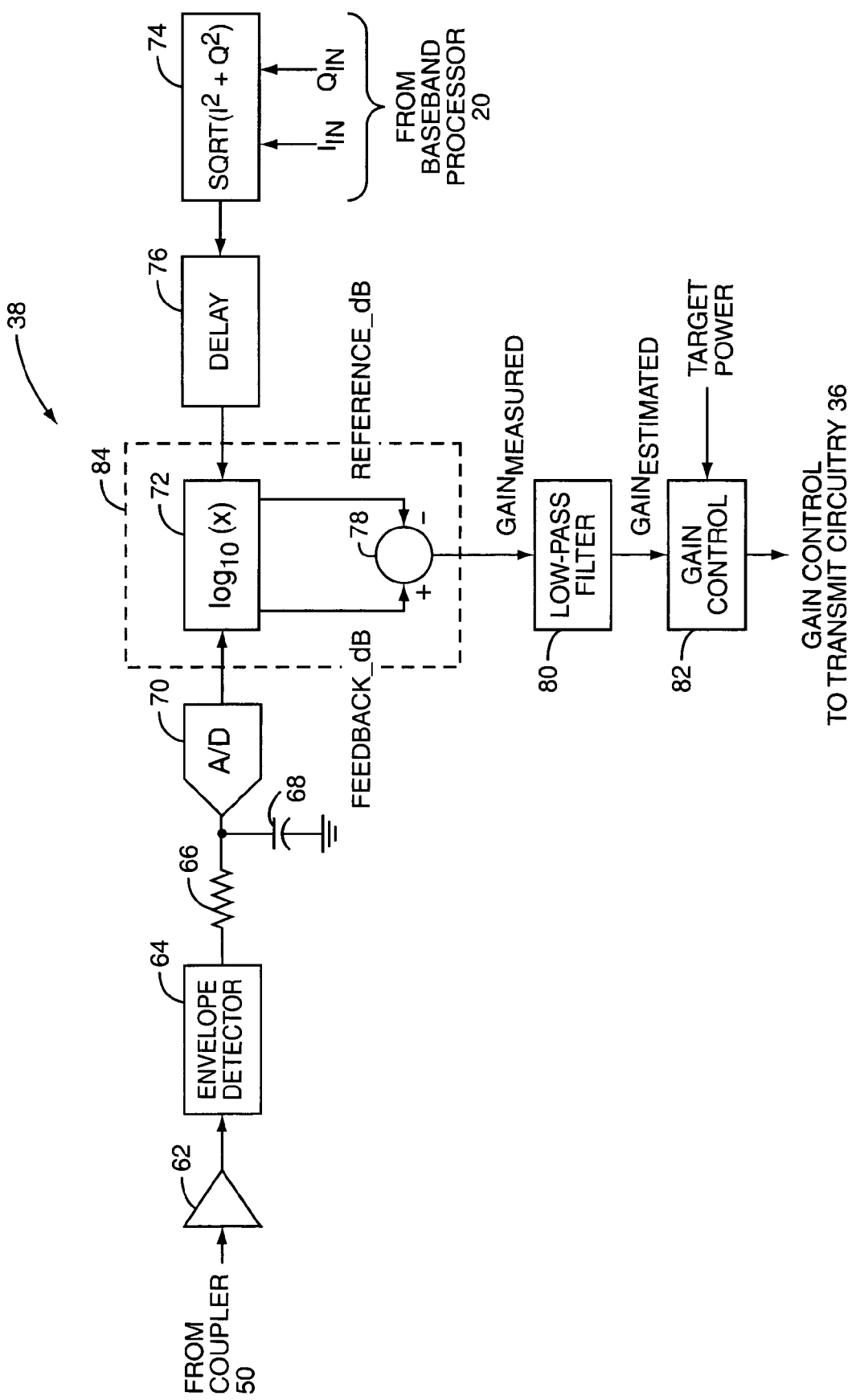
FIG. 2 illustrates power control circuitry for controlling the output power of the mobile terminal of FIG. 1 according to one embodiment of the present invention.

FIG. 2 illustrates a first embodiment of the power control circuitry 38 of the present invention. In this embodiment, the detected signal from the coupler 50 (FIG. 1) is amplified by amplifier 62. Envelope detector 64 operates to detect an envelope of the detected signal, thereby providing a feedback amplitude signal indicative of the output power of the power amplifier circuitry 48 (FIG. 1). The feedback amplitude signal is essentially equal to an amplitude modulation component multiplied by the gain of the transmit circuitry 36 (FIG. 1). The amplitude modulation component corresponds to the amplitude component of the quadrature baseband signal ($I_{BB}$, $Q_{BB}$).

The feedback amplitude signal is filtered by a low-pass filter formed by resistor 66 and capacitor 68 to prevent aliasing when the feedback amplitude signal is digitized by analog-to-digital (A/D) converter 70. After digitization, the digitized feedback amplitude signal is converted to logarithmic scale, or decibels, by logarithmic generation circuitry 72. The logarithmic generation circuitry 72 may be a look-up table or a processor that mathematically computes the logarithm of the digitized feedback amplitude signal.

Amplitude generation circuitry 74 generates a reference amplitude signal using the digital quadrature baseband signal ($I_{BB}$, $Q_{BB}$) from the baseband processor 20 (FIG. 1). More specifically, the amplitude generation circuitry 74 generates the reference amplitude signal by determining the square root of $I^2_{BB}+Q^2_{BB}$. The amplitude generation circuitry 74 may be a look-up table or a processor that mathematically computes the reference amplitude signal based on the digital quadrature baseband signal ($I_{BB}$, $Q_{BB}$). The reference amplitude signal is delayed by delay circuitry 76 such that the reference amplitude signal is essentially time-aligned with the digitized feedback amplitude signal from the A/D converter 70. As such, the delay of the delay circuitry 76 is approximately equal to the inherent delay of the transmit circuitry 36 (FIG. 1). The delayed reference amplitude signal is converted to logarithmic scale, or decibels, by the logarithmic generation circuitry 72.

Subtraction circuitry 78 operates to provide a measured gain signal ($GAIN_{MEASURED}$) by determining a difference between the feedback signal (FEEDBACK_dB) and the reference amplitude signal (REFERENCE_dB). However, due to errors such as an error in the time-alignment of the feedback amplitude signal and the reference amplitude signal, noise, non-linearities of the envelope detector 64, and DC offset, the measured gain signal ($GAIN_{MEASURED}$) may include an error. In order to remove this error, optional low-pass filtering circuitry 80 may be provided to filter the measured gain signal ($GAIN_{MEASURED}$) to provide an estimated gain signal ($GAIN_{ESTIMATED}$). However, it should be noted that the bandwidth of the low-pass filtering circuitry 80 is relatively large and, as such, has a fast settling time. For example, the bandwidth of the low-pass filtering circuitry 80 may be selected such that the settling time for the low-pass filtering circuitry 80 is approximately 10 microseconds.

The estimated gain signal ($GAIN_{ESTIMATED}$) is provided to gain control circuitry 82. Based on the estimated gain signal ($GAIN_{ESTIMATED}$) and the target output power, the gain control circuitry 82 operates to adjust the gain of the transmit circuitry 36 (FIG. 1) such that the output power of the transmit circuitry 36 is within a predetermined range, such as ±0.5 dB, of the target output power. The gain control circuitry 82 may control the gain of the transmit circuitry 36 by, for example, controlling the gain of the power amplifier circuitry 48, activating or deactivating stages of the power amplifier circuitry 48, controlling the gain of the VGA 44, and/or controlling the gain of the I/Q modulation circuitry 42 using one or more gain control signals (GAIN CONTROL).

Thus, the power control circuitry 38 of FIG. 2 avoids the need for a low-bandwidth averaging filter to remove the amplitude modulation from the detected signal from the coupler 50 (FIG. 1). Accordingly, unlike systems using a low-bandwidth averaging filter, which may take approximately 200 microseconds to settle to within the desired accuracy range, the power control circuitry 38 removes the amplitude component of the detected signal using the reference amplitude signal. As a result, a low-bandwidth averaging filter is not needed, and the power control circuitry 38 provides fast and accurate output power correction that is performed during an available time period, which for WCDMA is approximately 50 microseconds, at the beginning of each transmit slot.

It should be noted that the logarithmic generation circuitry 72 and the subtraction circuitry 78 are generally referred to herein as gain determination circuitry 84. By converting the reference amplitude signal and the feedback amplitude signal into decibels, the logarithmic generation circuitry 72 allows the measured gain signal ($GAIN_{MEASURED}$) to be provided by subtraction circuitry 78. However, in an alternative embodiment, the gain determination circuitry 84 may include ratio calculation circuitry operating to provide the measured gain signal ($GAIN_{MEASURED}$) by determining a ratio of the feedback amplitude signal to the reference amplitude signal.

Figure 3:
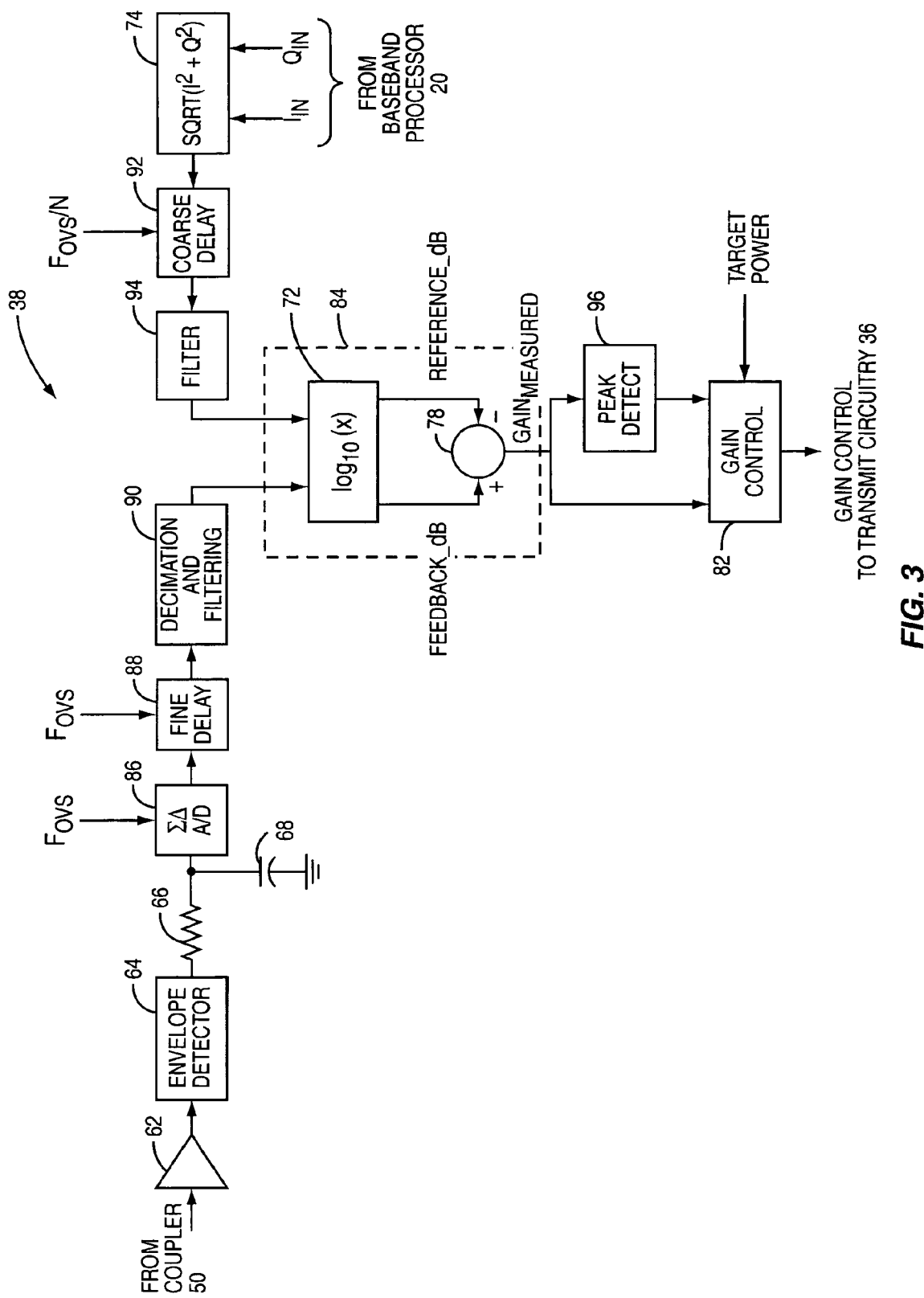
FIG. 3 illustrates power control circuitry for controlling the output power of the mobile terminal of FIG. 1 according to another embodiment of the present invention.

FIG. 3 illustrates another embodiment of the present invention similar to the embodiment of FIG. 2. In this embodiment, the detected signal from the coupler 50 (FIG. 1) is amplified by the amplifier 62. The envelope detector 64 operates to detect the envelope of the detected signal, thereby providing the feedback amplitude signal indicative of the output power of the power amplifier circuitry 48 (FIG. 1). The feedback amplitude signal is filtered by the low-pass filter formed by resistor 66 and capacitor 68 to prevent aliasing when the feedback signal is digitized by oversampling sigma-delta analog-to-digital (A/D) converter 86, which is clocked by an oversampling frequency ($F_{OVS}$). After digitization, the digitized feedback amplitude signal is delayed by fine delay circuitry 88, which is also clocked by the oversampling frequency ($F_{OVS}$). The delayed digitized feedback amplitude signal is then decimated and filtered by decimation and filtering circuitry 90 to reduce the sampling rate of the feedback amplitude signal to the sampling rate of the reference amplitude signal, as will be apparent to one of ordinary skill in the art upon reading this disclosure. By filtering the digitized feedback amplitude signal, the decimation and filtering circuitry 90 also performs the function of the low-pass filtering circuitry 80 (FIG. 1) to remove high frequency errors from the digitized feedback amplitude signal. The digitized feedback amplitude signal from the decimation and filtering circuitry 90 is converted to logarithmic scale, or decibels, by the logarithmic generation circuitry 72. The logarithmic generation circuitry 72 may be a look-up table or a processor that mathematically computes the logarithm of the digitized feedback amplitude signal.

The amplitude generation circuitry 74 generates the reference amplitude signal using the digital quadrature baseband signal ($I_{BB}$, $Q_{BB}$) from the baseband processor 20 (FIG. 1). More specifically, the amplitude generation circuitry 74 generates the reference amplitude signal by determining the square root of $I^2_{BB}+Q^2_{BB}$. The amplitude generation circuitry 74 may be a look-up table or a processor that mathematically computes the reference amplitude signal based on the digital quadrature baseband signal ($I_{BB}$, $Q_{BB}$). The reference amplitude signal is delayed by coarse delay circuitry 92, which is clocked at a rate of $F_{OVS}/N$, such that the reference amplitude signal is time-aligned with the digitized feedback amplitude signal. In this embodiment, the coarse delay circuitry 92 operates together with the fine delay circuitry 88 to provide improved time-alignment of the reference amplitude signal and the digitized feedback amplitude signal. The delay of the coarse delay circuitry 92 is ideally equal to the inherent delay of the transmit circuitry 36 (FIG. 1) plus the delay of the fine delay circuitry 88. The delayed reference amplitude signal is filtered by filtering circuitry 94, which is matched to the filter of the decimation and filtering circuitry 90, and converted to logarithmic scale, or decibels, by the logarithmic generation circuitry 72.

Subtraction circuitry 78 operates to provide the measured gain signal ($GAIN_{MEASURED}$) by determining a difference between the feedback signal (FEEDBACK_dB) and the reference amplitude signal (REFERENCE_dB). The measured gain signal ($GAIN_{MEASURED}$) is provided to the gain control circuitry 82. Based on the measured gain signal ($GAIN_{MEASURED}$) and the target output power, the gain control circuitry 82 operates to adjust the gain of the transmit circuitry 36 (FIG. 1) such that the output power of the transmit circuitry 36 is within a predetermined range, such as ±0.5 dB, of the target output power.

Optionally, the measured gain signal ($GAIN_{MEASURED}$) may also be provided to peak detection circuitry 96. The peak detection circuitry 96 operates to detect the peak, or maximum value, of the measured gain signal ($GAIN_{MEASURED}$). The detected peak is provided to the gain control circuitry 82. Ideally, there should be essentially no ripple in the measured gain signal ($GAIN_{MEASURED}$). However, due to errors such as an error in the time-alignment of the digitized feedback amplitude signal and the reference amplitude signal, the measured gain signal ($GAIN_{MEASURED}$) may contain some ripple. If the difference between the measured gain signal ($GAIN_{MEASURED}$) and the detected peak is greater than a predetermined threshold, the gain control circuitry 82 may operate to readjust the delays of the fine delay circuitry 88 and/or the coarse delay circuitry 92 to improve the time-alignment between the digitized feedback amplitude signal and the reference amplitude signal.

Again, it should be noted that, by converting the reference amplitude signal and the feedback amplitude signal into decibels, the logarithmic generation circuitry 72 allows the measured gain signal ($GAIN_{MEASURED}$) to be provided by subtraction circuitry 78. However, in an alternative embodiment, the measured gain signal ($GAIN_{MEASURED}$) is provided by computing a ratio of the feedback amplitude signal and the reference amplitude signal.

Figure 4:
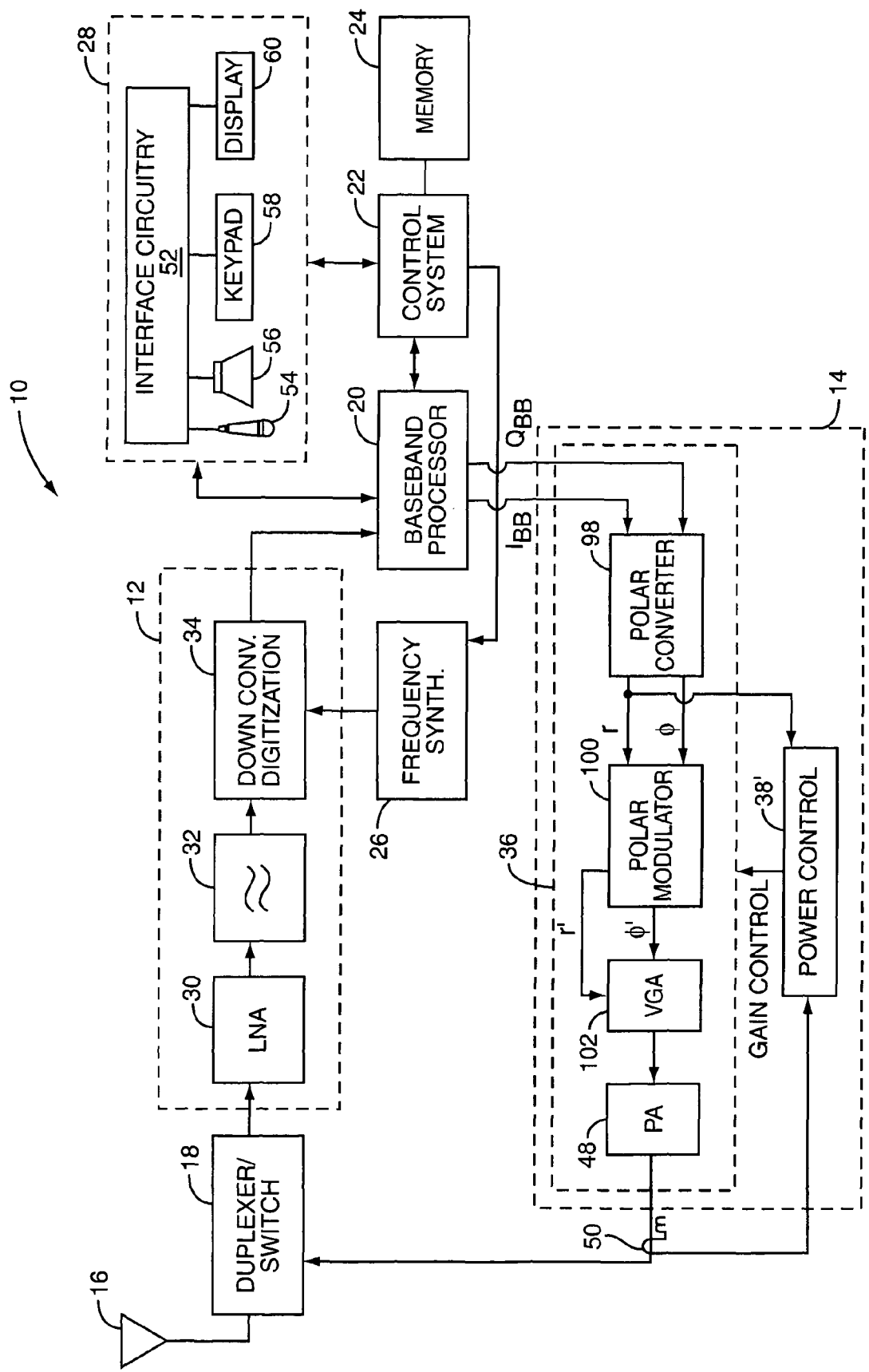
FIG. 4 illustrates a second exemplary embodiment of a mobile terminal according to one embodiment of the present invention.

FIG. 4 illustrates another embodiment of the mobile terminal of FIG. 1. In this embodiment, the transmit circuitry 36 operates according to a polar modulation scheme rather than an I/Q modulation scheme. More specifically, in this embodiment, the transmit circuitry 36 include a polar converter 98, polar modulation circuitry 100, a variable gain amplifier (VGA) 102, and the power amplifier circuitry 48. The polar converter 98 receives the digital quadrature baseband signal ($I_{BB}$, $Q_{BB}$) from the baseband processor 20, and converts the digital quadrature baseband signal ($I_{BB}$, $Q_{BB}$) to a digital polar signal (r, φ). The amplitude component (r) is provided to the power control circuitry 38', as described below in more detail. The digital polar signal (r, φ) is provided to the polar modulation circuitry 100. In one embodiment, the phase component (φ) is applied to a phase locked loop to modulate an analog radio frequency signal such that the phase locked loop, and thus the polar modulation circuitry 100, provides a radio frequency output signal (φ') to the VGA 102. The amplitude component (r) is processed to provide an analog amplitude modulation signal (r'), which is provided to the VGA 102 to control the gain of the VGA 102 to provide amplitude modulation to the radio frequency output signal (φ'). The modulated radio frequency signal from the VGA 102 is amplified by the power control circuitry 48 for transmission.

Figure 5:
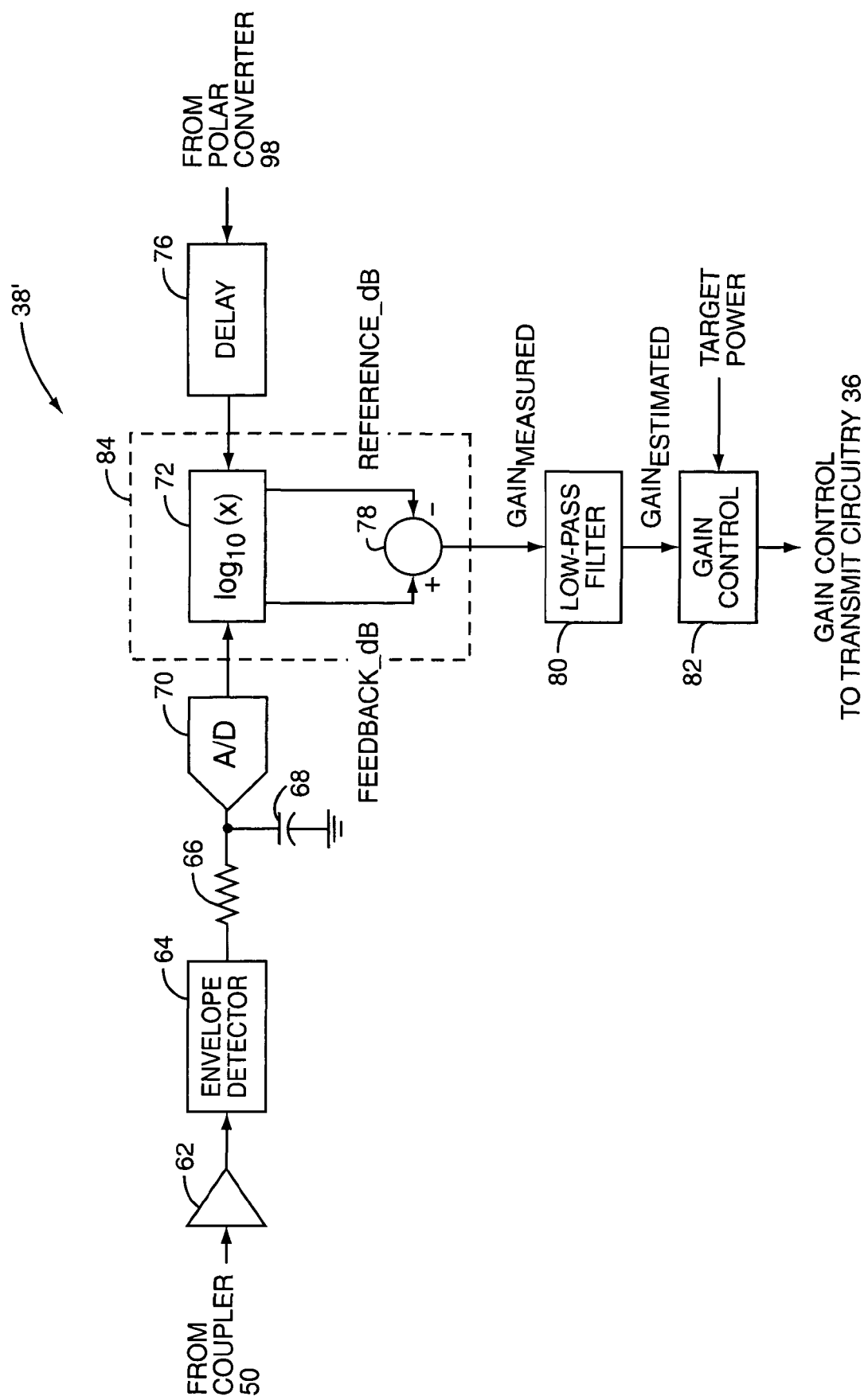
FIG. 5 illustrates power control circuitry for controlling the output power of the mobile terminal of FIG. 4 according to one embodiment of the present invention.
Figure 6:
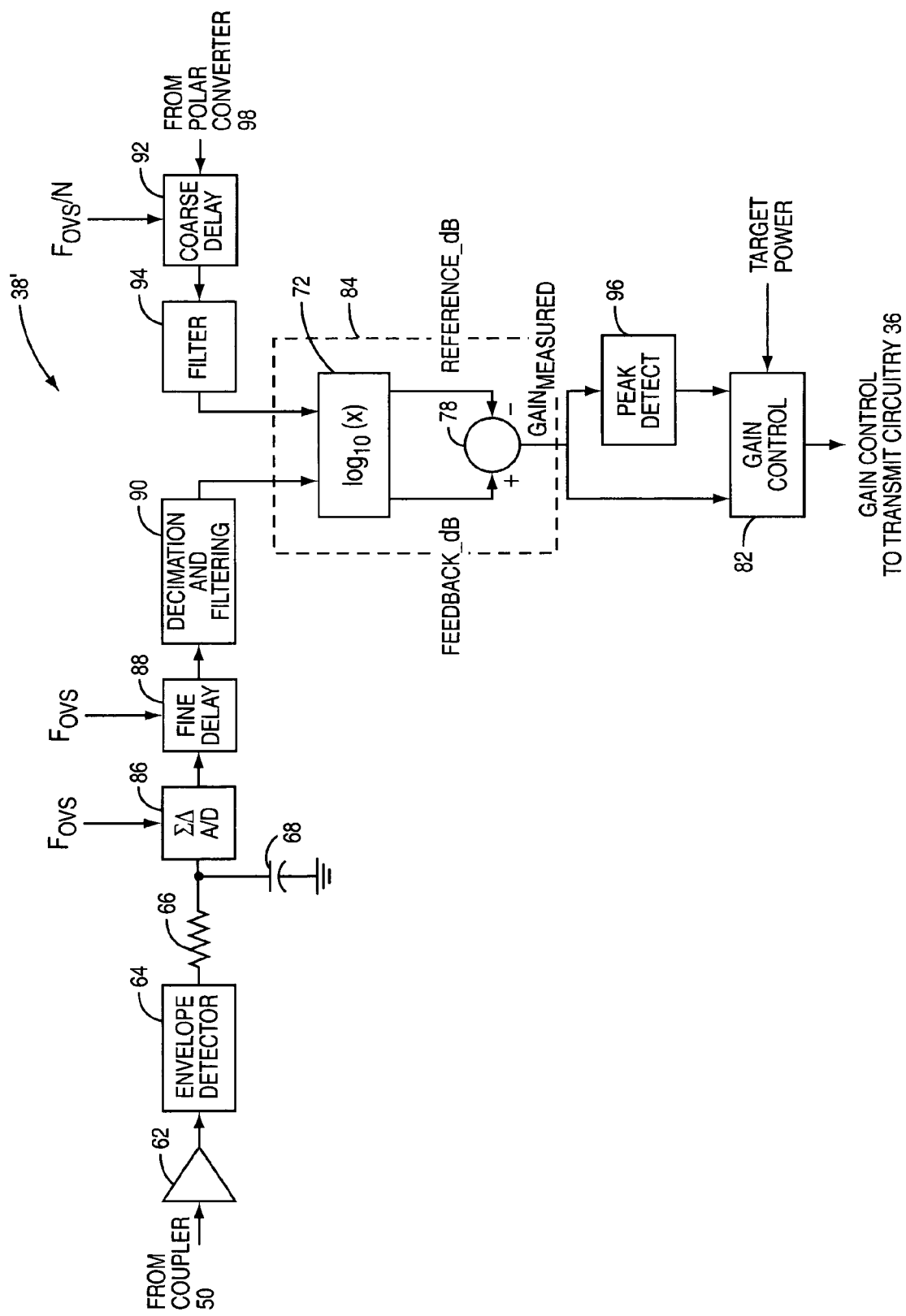
FIG. 6 illustrates power control circuitry for controlling the output power of the mobile terminal of FIG. 4 according to another embodiment of the present invention.

FIGS. 5 and 6 are similar to FIGS. 2 and 3, respectively, and illustrate exemplary embodiments of the power control circuitry 38' of FIG. 4. These embodiments are substantially the same as the embodiments of FIGS. 2 and 3. As such, the operation of the power control circuitry 38' is not described again for conciseness. However, in these embodiments, there is no need for the amplitude generation circuitry 74 (FIGS. 2 and 3). Instead, referring to FIG. 5, the amplitude component (r) from the polar converter 98 (FIG. 4) is provided to the delay circuitry 76. With respect to FIG. 6, the amplitude component (r) from the polar converter 98 (FIG. 4) is provided to the coarse delay circuitry 92. Thus, FIGS. 5 and 6 show that, in the case of a polar modulation transmitter, the amplitude component (r) of the polar signal may be used as the reference amplitude signal.

Those skilled in the art will recognize improvements and modifications to the preferred embodiments of the present invention. All such improvements and modifications are considered within the scope of the concepts disclosed herein and the claims that follow.

What is claimed is:

1. A system comprising:
    transmit circuitry adapted to process a quadrature baseband signal comprising an in-phase component and a quadrature-phase component to provide a radio frequency transmit signal;
    envelope detection circuitry in communication with the transmit circuitry, the envelope detection circuitry adapted to detect an envelope amplitude of the radio frequency transmit signal and generate a feedback amplitude signal based on the detected envelope amplitude;
    analog-to-digital conversion circuitry adapted to convert the feedback amplitude signal to a digitized feedback amplitude signal;

power control circuitry in communication with the analog-to-digital conversion circuitry, the power control circuitry adapted:
  to digitally calculate a reference amplitude feedback signal as a square root of the sum of the squares of the in-phase component and quadrature-phase component of the digital quadrature baseband signal;
  to generate a measured gain signal based upon a ratio of the digitized amplitude feedback signal to the reference amplitude feedback signal; and
  to adjust a gain of the transmit circuitry based on the transmit gain feedback signal such that an output power of the transmit circuitry is within a predetermined range about a target output power.

2. The system of claim 1 wherein the transmit circuitry operates according to a continuous time transmit scheme having a plurality of transmit slots and the power control circuitry operates to measure and adjust the gain of the transmit circuitry at a beginning of each transmit slot among the plurality of transmit slots.

3. The system of claim 1 wherein the transmit circuitry operates according to a Wideband Code Division Multiple Access (WCDMA) transmit scheme, and the power control circuitry operates to measure and adjust the gain of the transmit circuitry during approximately the first 50 microseconds of a transmit slot.

4. The system of claim 1 wherein the power control circuitry is further adapted to time-align the digitized feedback amplitude signal and the reference amplitude signal.

5. The system of claim 1 wherein the power control circuitry further comprises:
  delay circuitry adapted to delay the reference amplitude signal to to essentially time-align the reference amplitude signal with the digitized feedback amplitude signal; and
  gain determination circuitry adapted to determine a gain magnitude to provide the measured gain signal representative of the gain of the transmit circuitry based upon the digitized feedback amplitude and the time-aligned reference amplitude signal.

6. The system of claim 1 wherein the power control circuitry further comprises gain control circuitry adapted to adjust the gain of the transmit circuitry based on the measured gain signal and a target output power such that an output power of the transmit circuitry is within a predetermined range about the target output power.

7. The system of claim 6 wherein the power control circuitry further comprises low-pass filtering circuitry adapted to filter the measured gain signal to provide an estimated gain signal, and the gain control circuitry is further adapted to adjust the gain of the transmit circuitry based on the estimated gain signal and the target output power.

8. The system of claim 1 wherein the gain determination circuitry comprises:
  logarithmic generation circuitry adapted to convert the digitized feedback amplitude signal and the reference amplitude signal to decibels to provide a decibel feedback amplitude signal and a decibel reference amplitude signal; and
  subtraction circuitry adapted to provide the measured gain signal based on a difference of the decibel feedback amplitude signal and the decibel reference amplitude signal.

9. The system of claim 1 wherein the analog-to-digital conversion circuitry is adapted to oversample the the feedback amplitude signal to generate the digitized feedback amplitude signal, wherein the power control circuitry further comprises:
  fine delay circuitry adapted to delay the digitized feedback amplitude signal to provide a delayed feedback amplitude signal;
  decimation and filtering circuitry adapted to low-pass filter the delayed feedback amplitude signal and decrease a sampling rate of the filtered, delayed feedback amplitude signal to provide a decimated feedback amplitude signal;
  coarse delay circuitry adapted to delay the reference amplitude signal to provide a delayed reference signal, wherein the fine delay circuitry and the coarse delay circuitry are further adapted to essentially time-align the decimated feedback amplitude signal and a filtered reference amplitude signal;
  filtering circuitry adapted to filter the delayed reference signal to provide the filtered reference amplitude signal; and
  gain determination circuitry adapted to determine a gain magnitude of a ratio of the decimated feedback amplitude signal to the filtered reference amplitude signal to provide a measured gain signal representative of the gain of the transmit circuitry.

10. The system of claim 9 wherein the power control circuitry further comprises gain control circuitry adapted to adjust the gain of the transmit circuitry based on the measured gain signal and a target output power such that an output power of the transmit circuitry is within a predetermined range about the target output power.

11. The system of claim 10 wherein the power control circuitry further comprises low-pass filtering circuitry adapted to filter the measured gain signal to provide an estimated gain signal, and the gain control circuitry is adapted to adjust the gain of the transmit circuitry based on the estimated gain signal and the target output power.

12. The system of claim 9 wherein the filtering circuitry is matched to a filter of the decimation and filtering circuitry.

13. The system of claim 9 wherein the gain determination circuitry comprises:
  logarithmic generation circuitry adapted to convert the feedback amplitude signal and the reference amplitude signal to decibels to provide a decibel feedback amplitude signal and a decibel reference amplitude signal; and
  subtraction circuitry adapted to provide the measured gain signal based on a difference of the decibel feedback amplitude signal and the decibel reference amplitude signal.

14. The system of claim 1 wherein the power control circuitry is further adapted to:
  provide a logarithmic scaled feedback amplitude signal based on a logarithmic conversion of the feedback amplitude signal; and
  provide a logarithmic scaled reference amplitude signal based on a logarithmic conversion of the reference amplitude signal, wherein the first magnitude of the ratio is based on a difference between the logarithmic scaled feedback amplitude signal and the logarithmic scaled reference amplitude signal.

15. A method comprising:
  providing transmit circuitry adapted to process a quadrature baseband signal comprising an in-phase component and a quadrature-phase component to provide a radio frequency transmit signal;
  providing a detected signal indicative of the radio frequency transmit signal;

low pass filtering the detected signal to generate a filtered detected signal;

digitizing the filtered detected signal to generate a digitized detected signal providing a feedback amplitude signal indicative of an amplitude of the radio frequency transmit signal based on digitized detected signal;

digitally calculating a reference amplitude signal generated from the in-phase and quadrature-phase components of the quadrature baseband signal, wherein the reference amplitude signal is a square root of the sum of the squares of the in-phase component and quadrature-phase component of the quadrature baseband signal;

determining a first magnitude of a ratio of the feedback amplitude signal to the reference amplitude signal;

generating a measured gain signal having a second magnitude based on the first magnitude; and adjusting a gain of the transmit circuitry based on the measured gain signal and a target output power such that an output power of the transmit circuitry is within a predetermined range about the target output power, wherein the measured gain signal is representative of the gain of the transmit circuitry.

16. A system comprising:

transmit circuitry adapted to:

process a quadrature baseband signal comprising an in-phase component and a quadrature-phase component to provide a radio frequency transmit signal; and provide a detected signal indicative of the radio frequency transmit signal; and power control circuitry adapted to:

provide a feedback amplitude signal indicative of an amplitude of the radio frequency transmit signal based on the detected signal;

provide a reference amplitude signal generated from the square root of a sum of squares of in-phase and quadrature-phase components of the quadrature baseband signal;

determine a first magnitude of a ratio of the feedback amplitude signal to the reference amplitude signal;

generate a measured gain signal having a second magnitude based on the first magnitude; and adjust a gain of the transmit circuitry based on the measured gain signal and a target output power such that an output power of the transmit circuitry is within a predetermined range about the target output power, wherein the measured gain signal is representative of the gain of the transmit circuitry.

17. The system of claim 16 wherein the power control circuitry is further adapted to:

provide a logarithmic scaled feedback amplitude signal based on a logarithmic conversion of the feedback amplitude signal; and provide a logarithmic scaled reference amplitude signal based on a logarithmic conversion of the reference amplitude signal, wherein the first magnitude of the ratio is based on a difference between the logarithmic scaled feedback amplitude signal and the logarithmic scaled reference amplitude signal.

18. The system of claim 12 wherein the power control circuitry is further adapted to adjust the gain of the transmit circuitry based on the measured gain signal and a target output power such that an output power of the transmit circuitry is within a predetermined range about the target output power.

* * * * *

UNITED STATES PATENT AND TRADEMARK OFFICE
CERTIFICATE OF CORRECTION

PATENT NO. : 7,773,691 B2
APPLICATION NO. : 11/113873
DATED : August 10, 2010
INVENTOR(S) : Khlat et al.

It is certified that error appears in the above-identified patent and that said Letters Patent is hereby corrected as shown below:

In column 12, at line 26, change "The system of claim 12" to --The system of claim 16--.

Signed and Sealed this

Twenty-eighth Day of September, 2010

David J. Kappos
*Director of the United States Patent and Trademark Office*